(12) United States Patent
Meriles

(10) Patent No.: US 7,199,584 B2
(45) Date of Patent: Apr. 3, 2007

(54) METHOD AND APPARATUS FOR HIGH RESOLUTION NUCLEAR MAGNETIC RESONANCE IMAGING AND SPECTROSCOPY

(75) Inventor: Carlos Meriles, Fort Lee, NJ (US)

(73) Assignee: Research Foundation of the City University of New York, New York, NY (US)

(*) Notice: Subject to any disclaimer, the term of this patent is extended or adjusted under 35 U.S.C. 154(b) by 0 days.

(21) Appl. No.: 11/147,716

(22) Filed: Jun. 7, 2005

(65) Prior Publication Data

US 2006/0273794 A1    Dec. 7, 2006

(51) Int. Cl.
*G01V 3/00* (2006.01)
(52) U.S. Cl. ...................... 324/316; 324/300
(58) Field of Classification Search ........ 324/300–322; 600/410–424
See application file for complete search history.

(56) References Cited

U.S. PATENT DOCUMENTS

| | | | |
|---|---|---|---|
| 5,821,410 A * | 10/1998 | Xiang et al. | ................... 73/105 |
| 6,173,604 B1 * | 1/2001 | Xiang et al. | ................... 73/105 |
| 6,311,086 B1 * | 10/2001 | Ardenkjaer-Larsen et al. | ... 600/420 |
| 6,532,806 B1 * | 3/2003 | Xiang et al. | ................... 73/105 |
| 6,693,426 B1 * | 2/2004 | Xiang et al. | ................. 324/300 |
| 6,911,646 B1 * | 6/2005 | Weitekamp | ................. 250/234 |
| 6,975,896 B2 * | 12/2005 | Ehnholm et al. | ........... 600/414 |
| 2006/0071662 A1 * | 4/2006 | Xiang et al. | ................. 324/316 |

OTHER PUBLICATIONS

J.M. Kikkawa, et al., "All-Optical Magnetic Resonance in Semiconductors," *Science*, vol. 287, pp. 473-476 (2000).

D. Gammon, et al., "Nuclear Spectroscopy in Single Quantum Dots: Nanoscopic Raman Scattering and Nuclear Magnetic Resonance," *Science*, vol. 277, pp. 85-88 (1997).

G. Salis, et al., "Origin of Enhanced Dynamic Nuclear Polarization and All-Optical Nuclear Magnetic Resonance in GaAs Quantum Wells," *Physical Review B*, vol. 64, pp. 195304-1-195304-10 (2001).

M. Bruchez Jr., et al., "Semiconductor Nanocrystals as Fluorescent Biological Labels," *Science*, vol. 281, pp. 2013-2016 (1998).

G. Yusa, et al., "Controlled Multiple Quantum Coherences of Nuclear Spins in a Nanometre-Scale Device," *Nature*, vol. 434, pp. 1001-1005 (2005).

* cited by examiner

*Primary Examiner*—Brij B. Shrivastav
(74) *Attorney, Agent, or Firm*—Hoffmann & Baron, LLP; Irving N. Feit

(57) ABSTRACT

A probe, device, and methods for performing nuclear magnetic resonance (NMR) measurements on a suitable sample are provided. The probe includes a hyper polarized tip positioned to cause a dipolar interaction between the tip and sample. The nuclear magnetic spin of a selected portion of the sample induces a modulation of tip magnetization, which is proportional to the local magnetization of the selected portion. An NMR device includes the probe, a radio frequency (RF) coil for manipulating spins in the sample and tip, and a means for detecting the modulation of tip magnetization. An RF pulse sequence selects the selected portion and allows detection of the modulation. The method for obtaining NMR data includes positioning the tip to induce the dipolar interaction; selecting the sample portion; modulating the tip magnetization in response thereto; and detecting the tip modulation. The device and method may be adapted to obtain NMR images and spectroscopy.

41 Claims, 7 Drawing Sheets

5μm

METHOD AND APPARATUS FOR HIGH RESOLUTION NUCLEAR MAGNETIC RESONANCE IMAGING AND SPECTROSCOPY

FIELD OF THE INVENTION

The present invention relates generally to nuclear magnetic resonance devices, and more particularly, to a method and apparatus for sub-microscopic, high-sensitivity magnetic resonance imaging and spectroscopy.

BACKGROUND OF THE INVENTION

Nuclear magnetic resonance (NMR) is a popular tool for studying the physical, chemical and biological properties of matter at a molecular level, due to the flexibility and analytical capability of the technique. For example, NMR imaging techniques are routinely used by chemists to determine the structure of complicated molecules. Such techniques complement traditional x-ray crystallographic as a method for determining smaller protein structures of 25 kDa or less.

NMR takes advantage of the measurable behavior of the nuclei of certain atoms, when placed in a static magnetic field. Most nuclei possess a non zero spin and thus have a nuclear magnetic moment. In a semi-classical treatment, as the positively charged nucleus spins, the moving charge creates a magnetic moment.

When no external magnetic field is applied, the magnetic moments of nuclei are aligned randomly. However, if the nuclei are placed in an external homogeneous magnetic field ($B_0$), the magnetic moments will either align with the external magnetic field or in opposition to the magnetic field. The alignment of the groups according to one of the two possible orientations follows Boltzmann's statistics and results in a population imbalance among the different energy levels and a net nuclear magnetization M. Accordingly, there will be slightly more nuclei at the lower energy level than at the higher energy level.

Because nuclei behave like magnets, the nuclei have a lower energy state when aligned with the applied magnetic field than when the nuclei are opposed to the magnetic field. A nucleus in the low energy state may transition to a high-energy state by the absorption of a photon that has an energy that is exactly equal to the energy difference between the two energy states. The energy of a photon is related to its frequency by Plank's constant. The frequency of the photon and the equivalent frequency of precession are referred to as the resonance or Larmor frequency.

Thus, it is possible to make magnetic dipoles "flip" from the low energy, more stable alignment to the high energy, less stable alignment by supplying the right amount of energy. The energy necessary to make this transition depends on the strength of the external magnetic field used and is usually in the range of energies found in radio waves. Therefore, the nuclei can absorb and reemit energy at characteristic radiofrequencies (RF). Furthermore, energy will be absorbed by the same nuclear species at slightly different frequencies depending on the molecular environment of the nucleus of a particular atom.

The precise resonant frequency of the nuclear species is dependent on the magnetic field at the nucleus, and will vary depending on the types of nuclei and the bonds in the molecule involving the nuclei. This characteristic variance in the resonance frequency depending on the chemical environment of the nucleus is called the chemical shift ($\delta$) and can be used to deduce the patterns of atomic bonding in the molecule. In particular, the chemical shift is the frequency difference between the observed resonance and a resonance from a standard compound and is usually reported in parts per million (ppm) of the mean resonance frequency.

In the typical NMR experiment, a sample to be analyzed is placed in a homogeneous static external magnetic field ($B_0$). By convention, $B_0$ and the net magnetization vector ($M_z$) reside on the z-axis at equilibrium. Also by convention, a rotating frame of reference rotating around the z-axis at the Larmor frequency allows $B_0$ and net nuclear magnetization M to appear static, i.e., the x' and y' axes rotate about the z-axis.

Accordingly, an applied radio frequency (RF) pulse has a stationary field vector in the xy plane within this reference frame with a direction governed by the phase of the radio frequency. The application of an RF pulse along the x-axis rotates the nuclear magnetization vector towards the y-axis at an angle that is proportional to the duration and intensity of the RF pulse. A pulse that is of sufficient duration and intensity to rotate the magnetization vector clockwise 90 degrees about the x-axis is termed a 90 degree (90°) or $\pi/2$ pulse. Similarly, a 180° pulse will rotate the magnetization vector 180 degrees and is called a $\pi$ pulse.

Predictably, the populations of nuclei relax to equilibrium at an exponential rate after the termination of the applied RF pulse. Once the magnetization vector is placed onto the y-axis, it rotates in the xy plane at a resonant frequency ultimately decaying back to the z-axis emitting RF radiation over time. This is typically the point of data acquisition. A receiver coil resonant at the Larmor frequency, generally located along the x-axis, can detect this rotation, which is commonly referred to as the free induction decay (FID). Fourier transformation of the FID provides the NMR spectrum.

One time constant used to describe this return to equilibrium is called the longitudinal or spin lattice relaxation time ($T_1$). The time ($T_1$) will vary as a function of the magnetic field strength. A second time constant, known as the spin-spin relaxation time ($T_2$), which is due to the exchange of energy between spins, is a description of the return to equilibrium of the transverse magnetization ($M_{xy}$) and is always equal to or less than $T_1$.

A spin-echo pulse sequence is normally required to measure $T_2$. The typical pulse-sequence consists of the application of a 90° pulse, which results in the rotation of the magnetization to the xy plane, followed by a 180° pulse that allows the magnetization to partially rephase producing a non-dephased signal called an echo.

In general, the practice of high-resolution NMR spectroscopy yields information about molecular structure and dynamics through the observation of interactions such as chemical shifts and scalar, dipole, quadrupole coupling interactions and the like. These features make NMR a powerful analytical tool, particularly for the study of dynamic processes such as the metabolism of plants and organisms, and the dynamics of geological processes, as well as for characterization of technologically important new materials.

One of the main disadvantages of NMR, however, is its limited sensitivity. The amount of sample necessary to get a readable signal is invariably fairly large, because in conventional NMR, the signal to noise ratio is proportional to the nuclear magnetic polarization of the sample. In addition, despite steady progress in the construction of stronger superconducting magnets, the nuclear magnetic polarization is only a small fraction of the attainable maximum (~$10^{-4}$ for protons in a 14 T magnet). Typically, $10^{16}$–$10^{18}$ molecules are necessary for meaningful measurements. For a liquid or a solid, therefore, one needs under normal circumstances not less than a 1 mm³ sample.

Also, in conventional NMR, the detected signal results from a measurement of Faraday induction in the coil surrounding the sample, by monitoring the current induced in a tank circuit tuned to resonance. Compared to other detection methods, the sensitivity of this scheme is rather poor since, even with maximum polarization, the minimum number of spins needed to induce a measurable signal is invariably large. As a result, the spatial resolution currently achievable in Magnetic Resonance Imaging (MRI) or spectroscopy is limited to about 5 to 10 µm which represents a very important disadvantage when compared to microscopy techniques, e.g., near field scanning optical microscopy, scanning tunneling microscopy and transmission electron microscopy.

Accordingly, a need exists for a high resolution, high sensitivity NMR apparatus and method that can provide both spatial and spectroscopic data for a sample. The present invention satisfies those needs, as well as others, and generally overcomes the deficiencies found in the background art.

SUMMARY OF THE INVENTION

The present invention, which addresses the needs of the prior art, relates to a method and apparatus for providing high resolution, high sensitivity nuclear magnetic resonance (NMR) spatial and spectroscopic measurements of a sample.

In particular, the present invention provides a probe suitable for use in a nuclear magnetic resonance device for detecting a local magnetization of a sample that includes a material having a non-zero nuclear magnetic spin. The probe includes a tip having a material capable of being hyperpolarized, so that the tip acquires a magnetization in response to being hyperpolarized. The tip is positioned to cause a dipolar interaction between the tip and the sample. In response to this dipolar interaction, the non-zero nuclear magnetic spin of a selected portion of the sample induces a modulation of the tip magnetization, which, in turn, is proportional to the local magnetization of the portion of the sample selected for measurement.

A nuclear magnetic resonance device is also provided, which includes a probe with a tip including a material capable of being hyperpolarized, the tip acquiring a magnetization in response to being hyperpolarized. A coil is provided for manipulating nuclear magnetic spins in a sample and tip nuclear magnetic spins in the probe with a sequence of radio frequency pulses. The sequence of radio frequency pulses selects a portion of the sample for measurement and allows detection of a modulation of the tip magnetization. When the tip is positioned to cause a dipolar interaction of the tip with the sample, a local magnetization of the selected portion of the sample induces the modulation of the tip magnetization, which is proportional to the local magnetization of the selected portion. The device further includes a means for detecting the modulation of the magnetization in the tip, thus providing a measurement of the local magnetization.

The nuclear magnetic resonance device may further be adapted to provide a nuclear magnetic resonance image of the sample, by including, for example, a linear translator for stepping the probe to sequentially select a number of selected portions. The local magnetization of each selected portion can then be mapped in the sample as a function of a location of the probe.

The nuclear magnetic resonance device may additionally be adapted to provide local high-resolution spectroscopy measurements of the sample, whereby the coil is adapted to additionally produce the sequence of pulses at incremented time intervals for generating the local high-resolution spectroscopy measurements.

The present invention also provides a method for obtaining nuclear magnetic resonance data from a sample including a material having a non-zero nuclear magnetic spin. The method includes providing a hyperpolarized tip having a magnetization for probing a local magnetization of the sample, and positioning the hyperpolarized tip to induce a dipolar interaction between the tip and the sample. A portion of the sample is selected for obtaining the local magnetization from the selected portion and an amplitude of the magnetization in the tip is modulated in response to the selecting step. The method further includesdetecting the modulation of magnetization in the tip, wherein the modulation is proportional to the local magnetization in the selected portion.

A method for obtaining local high-resolution spectroscopic nuclear magnetic resonance data from a sample including a material having a non-zero nuclear magnetic spin is also provided. The method includes providing a hyperpolarized tip having a magnetization for probing a local magnetization of the sample, and positioning the hyperpolarized tip to induce a dipolar interaction between the tip and the sample. The method further includes applying a homogeneous excitation sequence of pulses separated by an initial evolution time to the sample, followed by a purging time. A portion of the sample is selected for obtaining the local magnetization by applying a preparation sequence of radio-frequency pulses including two pulses separated by a first evolution interval to the sample to select the portion. In response to this preparation sequence, the local magnetization of the selected portion induces a dipolar field on the tip.

The method further includes modulating the magnetization in the tip in response to the selecting step; and detecting the modulation of magnetization in the tip, which is proportional to the local magnetization in the selected portion. A second homogeneous excitation sequence of pulses separated by an incremented initial evolution time is applied to the sample, followed by the purging time, and a free induction decay is obtained. The selecting, modulating, detecting, and obtaining steps are repeated for the incremented initial evolution time to obtain a series of free induction decays. The time-dependent series is then Fourier transformed, wherein the Fourier transform provides high-resolution spectroscopic nuclear magnetic resonance data for the selected portion.

As a result, the present invention provides a method and apparatus for obtaining high-resolution, high-sensitivity NMR measurements of a sample. In particular, a method and apparatus for obtaining both high-resolution high-sensitivity NMR images and local spectroscopy of a sample are provided.

DETAILED DESCRIPTION OF THE INVENTION

A probe formed in accordance with the present invention is capable of detecting a local magnetization of a sample material having a nuclear magnetic spin with a spatial resolution comparable to the size of a tip of the probe and with a sensitivity independent of the sample magnetization. The present invention, therefore, relates to a method and device for obtaining high-resolution nuclear magnetic resonance imaging and high-sensitivity spectroscopy measurements of a sample of interest.

The method and apparatus of the present invention generally relate to ultra-sensitive detection of nuclear magnetic resonance (NMR) in samples of arbitrary composition, but have particular application to samples of biological relevance (protonated systems).

Figure 1:
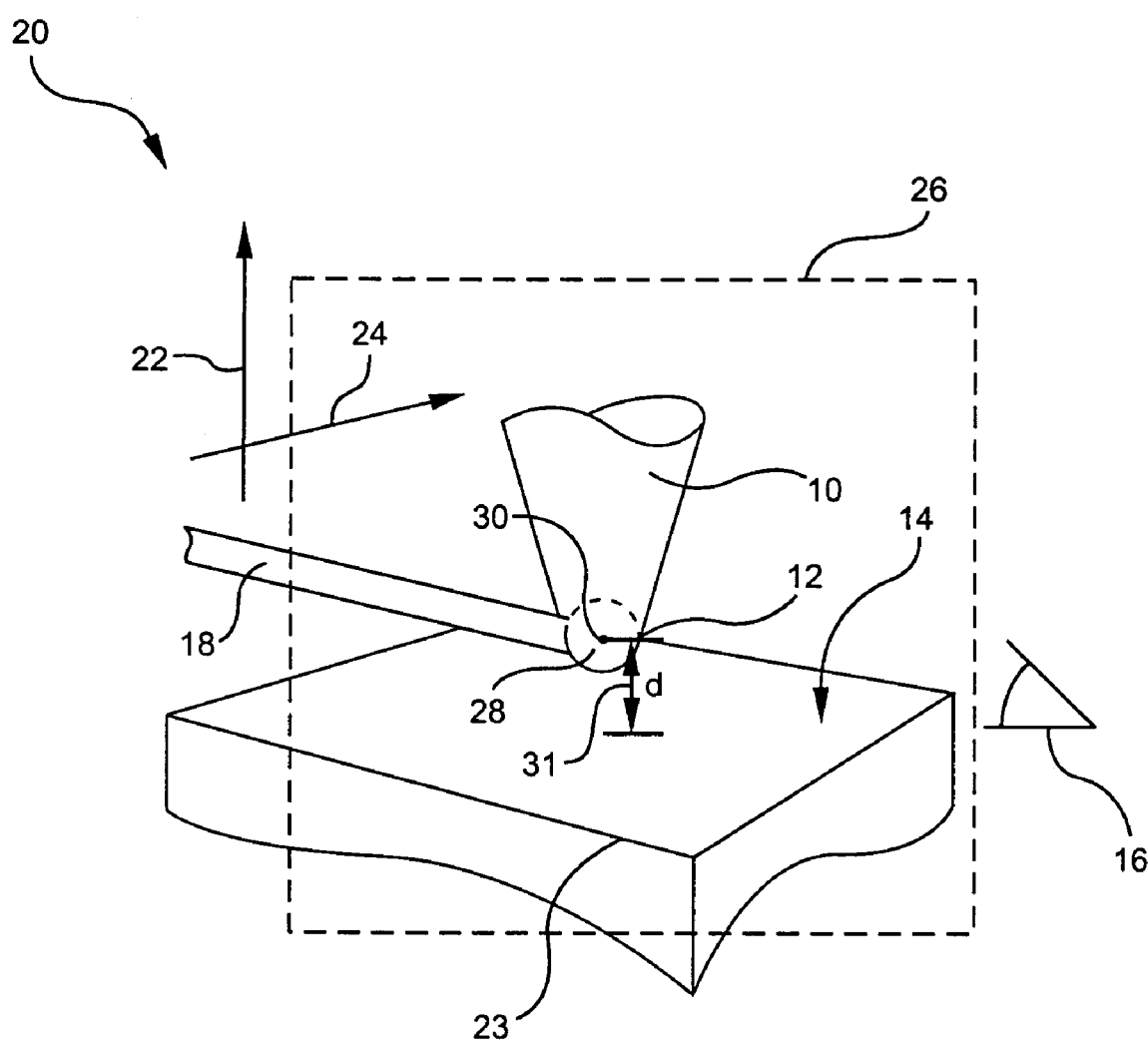
FIG. 1 is a perspective representation of an embodiment of a probe having a hyperpolarized tip, which is positioned near a surface of a sample, for use in obtaining nuclear magnetic resonance (NMR) spatial and spectroscopic measurements of the sample in accordance with the present invention.

Referring to FIG. 1, the probe 10 of the present invention includes a tip 12 composed of a material capable of being hyperpolarized, and which acquires a magnetization in response to being hyperpolarized. The hyperpolarized tip 12 is positioned to cause a dipolar interaction of the tip 12 with the sample material 14. Simultaneously, the nuclear magnetic spin of the sample material 14 induces a modulation of the tip's magnetization in response to the dipolar interaction, which is proportional to the local magnetization of the sample.

In the geometry shown in FIG. 1, the dipolar interaction occurs when the hyperpolarized tip 12 is positioned in sufficient proximity to the sample material 14. However, the present invention also provides for positioning the tip 12 within the sample material 14.

The probe 10 may also include a means for detecting 16 the modulation of the magnetization in the tip, or, optionally, the detection means 16 may be provided separately from the probe 10 itself.

The probe 10 may also include a hyperpolarizing source 18. Preferably, the source 18 and detecting means 16 are chosen to complement each other. For example, in one embodiment, the source includes a circularly polarized laser source and the means for detecting 16 includes an optical detector. The means for detecting 16 preferably further includes an optical analyzer for measuring a time-resolved rotation of the polarization state after transmission through the tip 12. The time-resolved rotation corresponds to the modulation of the magnetization.

The tip 12 of the probe 10 may include any material capable of being hyperpolarized, i.e., any material which can be excited to states of high nuclear polarization. In one preferred embodiment, the tip 12 includes a semiconductor material, preferably a III–V semiconductor, capable of being hyperpolarized by an optical source. Some examples of III–V semiconductors include Gallium Arsenide (GaAs), Gallium Phosphide (GaP), Gallium Aluminum Arsenide (GaAlAs), Indium Phosphide (IP), and Indium Antimonide (InSb).

Other semiconductor materials may also be used, including, but not limited to II–VI compounds, such as Cadmium Selenide (CdSe), Cadmium Telluride (CdTe), and organic semiconductors.

It is well-known that a circularly polarized laser beam can excite states of high nuclear polarization in semiconductors, resulting in a nuclear alignment in the semiconductor of up to at least 70%. This effect leads to the generation of an effective magnetic field acting on the semiconductor electrons, which, in turn, can be used to optically determine the nuclear polarization with exquisite sensitivity.

Various devices and methods have been used in the past to probe nuclear alignment of a material, all of which are suitable as a detecting means 16 in the present invention. Some examples include optical and electric means. Various optical means including those based on fluorescence detection and Faraday rotation, are described, for example, in Gammon, et al., "Nuclear Spectroscopy in Single Quantum Dots," *Science* 277: 85–88 (1997), and in Kikkawa, et al., "All-Optical Magnetic Resonance in Semiconductors," *Science* 287: 473–476 (2000), which are incorporated herein by reference.

An example of an optical means based on Faraday rotation is described in detail herein. It is understood, however, that the scope of the present invention is not limited to an optical source and/or to any one detecting means, but requires only that the tip 12 be capable of being hyperpolarized and that the resulting modulation of the tip magnetization when placed in proximity with the sample be measurable by a suitable detecting means 16.

An example of an electrical means includes electrical detection preferably used in conjunction with an electrical source, e.g., a current or voltage source, to hyperpolarize the tip. Referring to FIG. 1, in this embodiment, the tip 12 preferably includes a suitable semiconductor structure to which an electrical current may be applied as the source 18 for polarizing the semiconductor electrons.

The modulation of magnetization is then detected in a detecting step by monitoring a change in resistance before and after the encoding pulse sequence. This change in resistance ΔR provides a measure of the local magnetization of the selected portion of the sample. A method of using an electrical source and electrical detecting means to detect the modulation of magnetization in a semiconductor is provided in Yusa, et al., "Controlled Multiple Quantum Coherences of Nuclear Spins in a Nanometre-Scale Device," *Nature*, 434: 1001–1005 (April 2005), which is incorporated herein by reference.

Using the particular optical source and detecting means based on Faraday rotation, the electronic Larmor frequency within the semiconductive tip 12 is preferably determined by recording a temporal change in a linear polarization of a time-delayed "probe" pulse following a stronger (circularly-polarized) "pump" pulse. Once the probe 10 has been suitably hyperpolarized, the nuclear alignment alters (through a hyperfine coupling) an effective magnetic field acting on the semiconductor electrons in the tip 12. The degree of nuclear polarization then can be determined by comparing a measured precession frequency with the precession frequency exclusively due to an externally-applied magnetic field. This method of measuring the degree of nuclear polarization is advantageously sensitive and has been used to reconstruct nuclear magnetic resonance spectra in minuscule regions of a semiconductor, as described in Salis, G., et al., "Origin of Enhanced Dynamic Nuclear Polarization and All-Optical Nuclear Magnetic Resonances in GaAs Quantam Wells," *Phys. Rev. B*, 64: 195304 (2001), which is incorporated herein by reference.

A preferred method as well as an apparatus 20 for obtaining NMR measurements of a sample 14 using the probe 10 of the present invention is described herein by further reference to FIG. 1. The method includes providing a hyperpolarized tip 12, preferably including a semiconductor, suitable for probing magnetization of the sample 14. As described above, in a preferred embodiment, a semiconductor tip is hyperpolarized by optical pumping with either a continuous wave (CW) or a pulsed circularly polarized laser beam.

Referring to FIG. 1, the method further includes positioning the tip 12 to induce a dipolar interaction between the tip 12 and the sample 14. In the geometry of FIG. 1, the tip 12 is positioned close enough to the surface of an extended sample 14 to induce the dipolar interaction. It is then possible to use the tip dipolar field to select a region of interest, or portion, within the sample for probing. Multiple alternative uses of this selecting step can be appreciated. However, in the preferred embodiment, the selecting step restricts the sample magnetization to a small region of volume proportional to about the size of the tip. This step creates a sharply inhomogeneous distribution of magnetization in the selected portion of the sample.

Alternatively, the positioning step includes placing the tip 12 inside a sample. The probe 10 in this case may include a semiconductor structure having a shell around the tip, only the core (tip) of the structure being probed to measure magnetization. In one such embodiment, the probe 10 is a semiconductor nanocrystal, such as those known in the art for use as biological fluorescent labels, as described e.g., in Bruchez, et al., "Semiconductor Nanocrystals as Fluorescent Biological Labels," *Science* 281:2013–2016 (1998), which is incorporated herein by reference. Several nanocrystals may be embedded in the sample, e.g., a biological sample.

The same methods of the present invention may be applied to these nanocrystals as are applied to the tip 14 in the geometry shown in FIG. 1.

In a next step, an amplitude of the nuclear magnetization in the tip is modulated in response to said selecting step. The modulated magnetization in the tip is proportional to the magnetization in the selected portion of the sample. Therefore, the magnetization in the selected portion is then preferably measured by detecting the modulation of the tip magnetization.

As explained further below, in this preferred embodiment using an optical source to hyperpolarize the tip 12, an optical detecting means makes it possible to indirectly get local information on the sample with sensitivity independent of the sample's nuclear polarization.

An additional method of the present invention includes reconstructing images with a spatial discrimination comparable to or less than the size of the tip, using measurements of the magnetization of numerous portions of the sample according to the method described above. In addition, a method is provided for obtaining high-resolution spectra, optionally as a function of spatial location of the selected portion measured.

The method of the present invention for obtaining NMR measurements of the selected portion of the sample 14 preferably further includes applying an intense external magnetic field 22 to uniformly polarize the extended sample 14 in a direction perpendicular to its surface 23. The applied field 22 preferably initially aligns nuclear magnetic spins in the sample 14 and in the tip 12. The method further preferably includes applying a radio-frequency (RF) field to manipulate the evolution of the spin system in the sample 14 and in the tip 12 in order to obtain measurements of the magnetization of the selected sample portion.

The apparatus 20 preferably includes the probe 10, any magnetic means known to those skilled in the art for applying the external magnetic field 22, the means for detecting 16, and an RF coil 26, e.g., for providing an RF field 24 to the tip 12 and the sample 14. In one embodiment, one RF coil is provided for manipulating the sample 14 and the tip 12 separately as needed. This may be accomplished, for example, through the use of a multi-channel probe configuration according to means known to those skilled in the art.

In a different embodiment, two coils may be provided for separately providing the required RF field to each of the sample 14 and tip 12 according to the method of the present invention.

For simplicity, it is assumed herein that a hyperpolarized region 28 of the tip 12 is spherical with radius α. Given the well-known spatial dependence of a dipolar field due to a magnetized sphere, this assumption considerably simplifies the mathematical treatment. However, as discussed below, the inclusion of a more extended region throughout the tip body does not appear to represent a substantial factor in the analysis pertinent to the present method. It is also assumed that the center 30 of the hyperpolarized region 28 is located a distance d 31 from the surface 23 of the sample 14. In this case, the tip 12 induces a dipolar magnetic field of the form $$B_{tip} = \frac{\mu_0}{3r'^3}\left(\frac{a}{d}\right)^3 (3(M_{tip}^{(0)} \cdot \hat{r}')\hat{r}' - M_{tip}^{(0)}). \tag{1}$$

$M_{tip}^{(0)}$ represents a (pumped) nuclear magnetization in the tip 12, which, is collinear with the external field 22, $\mu_0$ is the vacuum magnetic permeability, and r' is a vector from the surface of the sample 14 to the center 30 of the sphere 28; the prime indicates that the coordinates have been expressed in units of the distance d. The spatial variation of the dipolar field represented by Equation (1) is preferably used in the selecting step to select the sample region to be probed.

Figure 4:
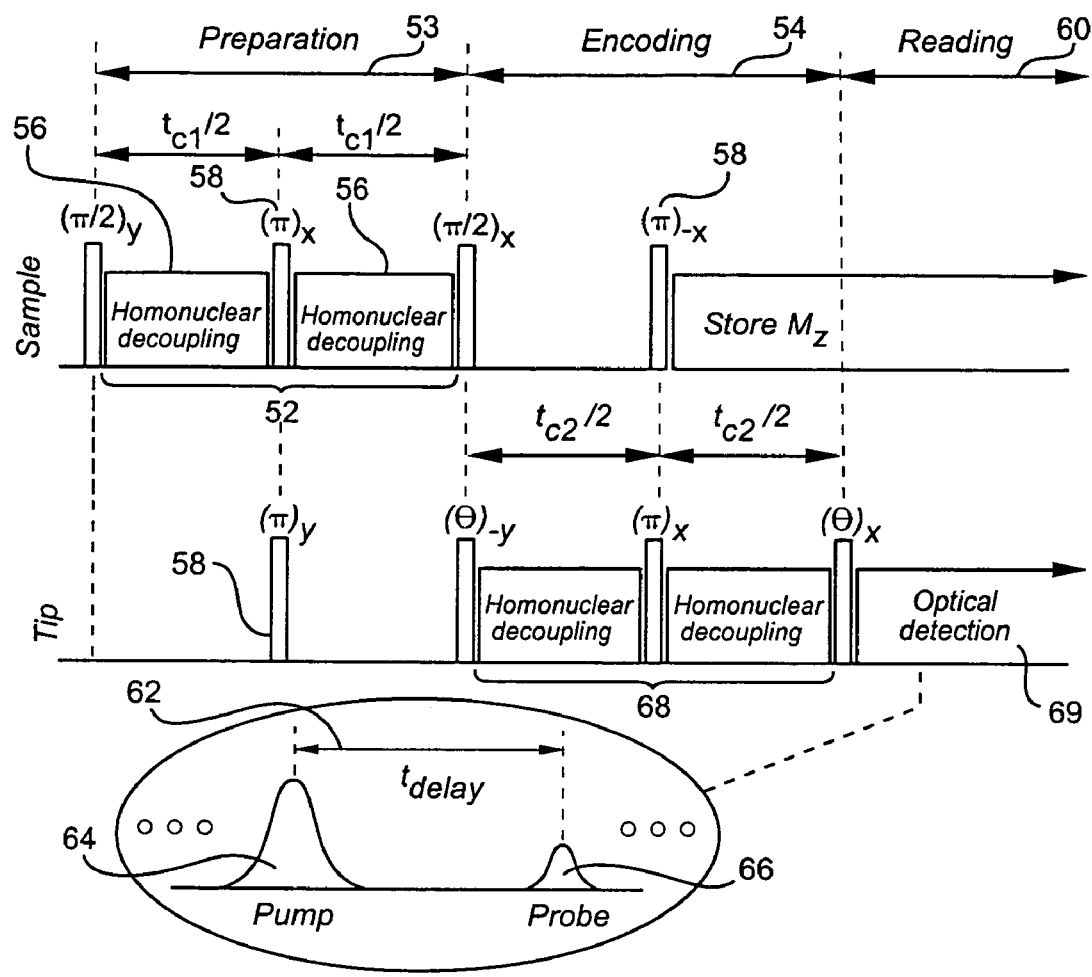
FIG. 4 is a plot of one embodiment of a pulse sequence used in conjunction with the probe of FIG. 1 for the detection of the sample magnetization in accordance with the present invention.

In other words, referring also to FIG. 4, in the selecting step, the dipolar field is manipulated to select the portion of the sample 14 by applying a preparational sequence 52 of RF pulses during a preparation period 53.

In one particular embodiment, for example, a preparation RF pulse sequence 52 $(\pi/2)_y - t_{c1} - (\pi/2)_x$ is first applied to act on the nuclei and control the distribution of magnetization in the sample 14. According to well-known conventional notation used in NMR, the sub-index in each pulse indicates the RF phase in the rotating frame. In addition, $t_{c1}$ represents a so-called variable evolution interval between the pulses. In practical terms, $t_{c1}$ corresponds to a sample-tip contact time. If for now spin interactions (i.e. dipolar, J-coupling, chemical shift, etc.) are neglected, a simple calculation shows that at the end of the sequence 52 the magnetization along the z-direction (parallel to the external magnetic field $B_0$ 22) is given by $$M_{spl}^{(z)}(t_{c1}) = M_{spl}^{(0)} \sin(\gamma_{spl} t_{c1} (B_{tip})_z). \quad (2)$$

$M_{spl}^{(0)}$ represents the equilibrium magnetization in the sample 14 and $\gamma_{spl}$ is the nuclear gyromagnetic ratio of the probed nuclei in the selected portion of the sample. Finally, $(B_{tip})_z = (B_{tip}^{max}/2r'^5)(3z'^2 - r'^2)$ is the z-component of the dipolar field primed coordinates; and $B^{tipmax} = (2\mu_0/3) M_{tip}^{(0)} (\alpha/d)^3$ is the maximum value of this field over the sample.

Figure 2A:
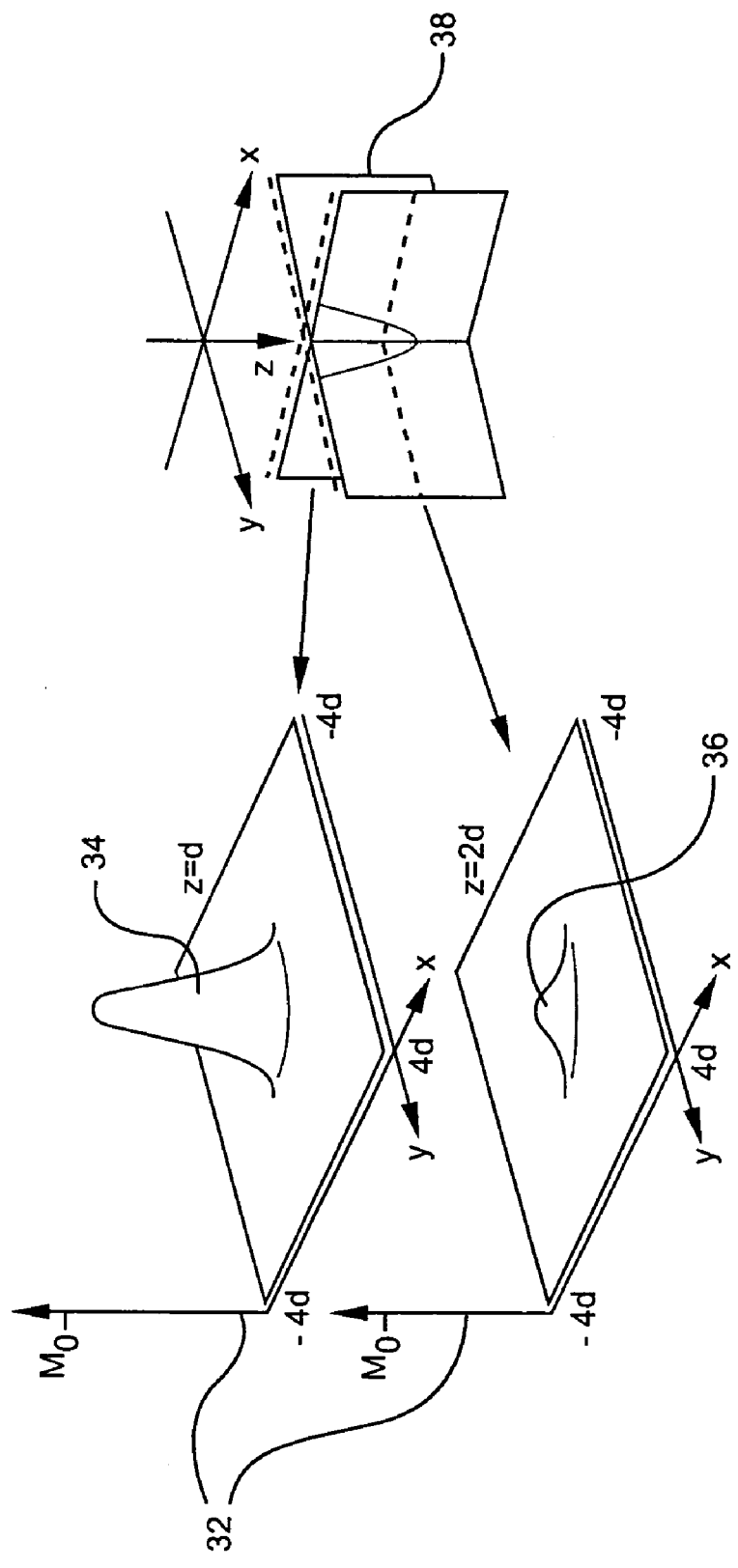
FIG. 2A shows a three-dimensional plot in two different planes, one plane being on the sample surface (top plot) and the other at a distance within the sample, of a spatial distribution of a sample nuclear magnetization. This distribution is obtained after applying a preparation sequence of radio-frequency (RF) pulses in the presence of a long-range dipolar field from the hyperpolarized tip of FIG. 1.
Figure 2B:
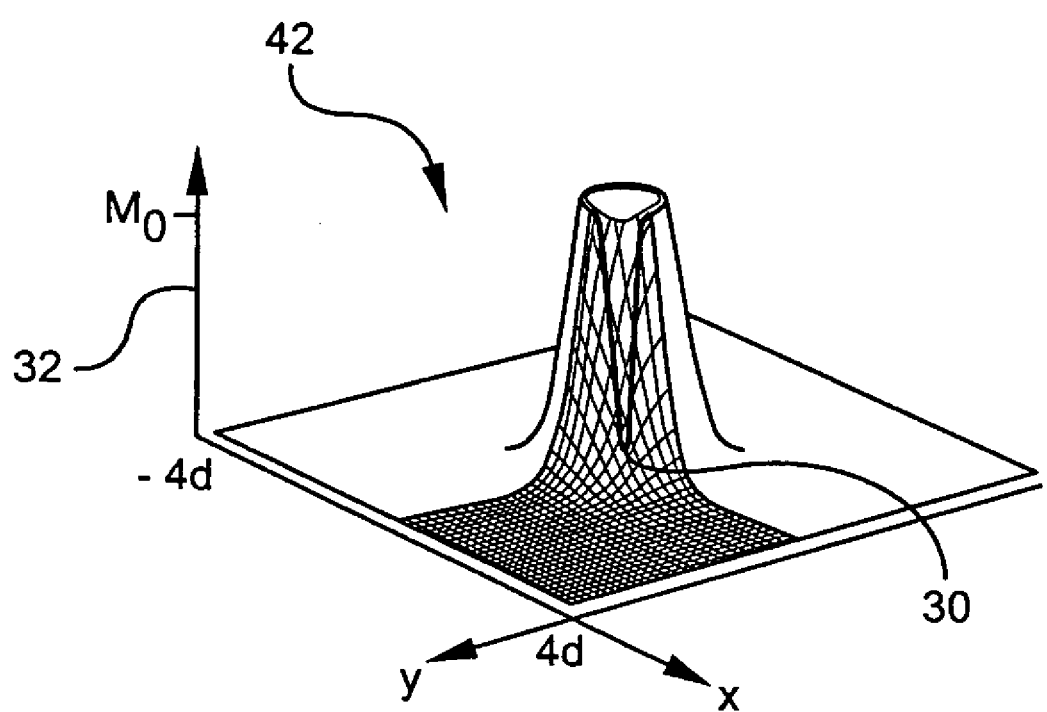
FIG. 2B is a three-dimensional plot of the spatial distribution of the sample nuclear magnetization at the sample surface due to the hyperpolarized tip of FIG. 1, for twice the evolution interval of FIG. 2A.
Figure 3:
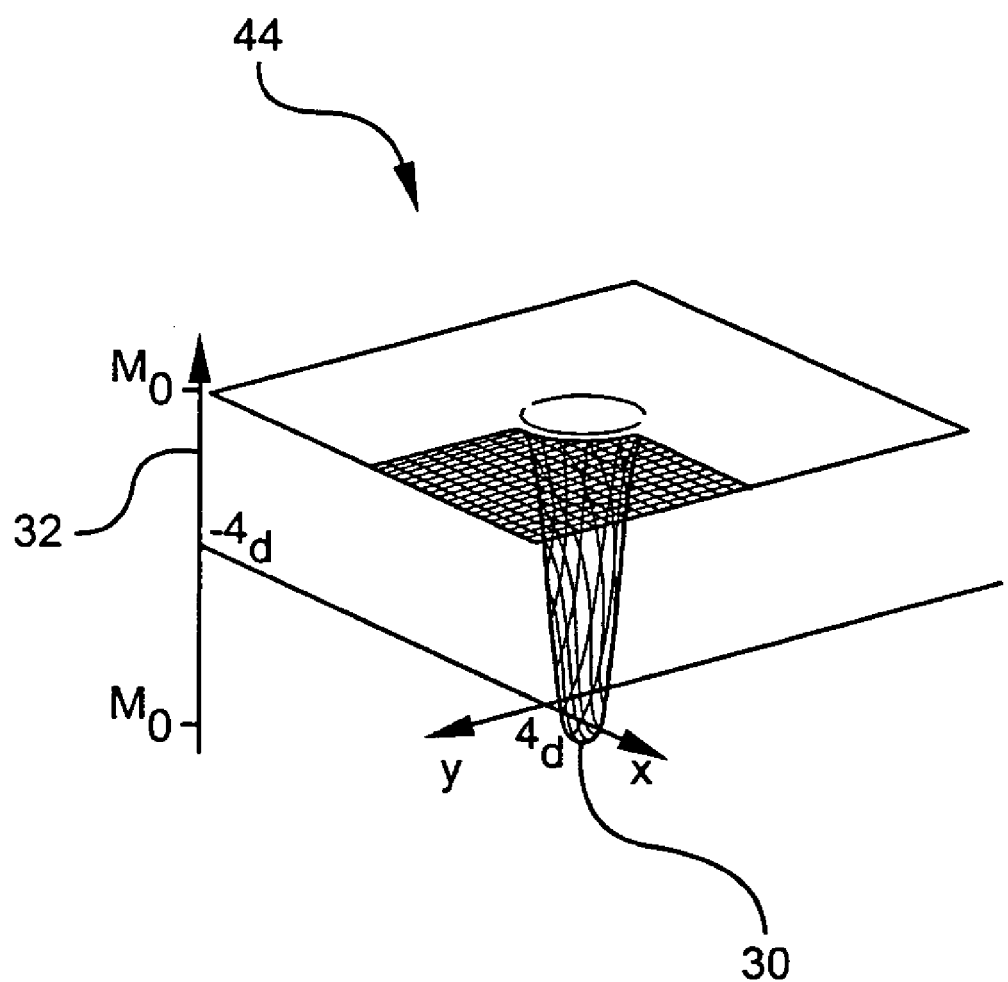
FIG. 3 is a three-dimensional plot of the spatial distribution of the sample nuclear magnetization at the sample surface due to the hyperpolarized tip of FIG. 1, for a different evolution interval and for a different phase of the second pulse than shown in FIGS. 2 A or 2B.

The use of the preparation sequence 52 to manipulate the dipolar field due to positioning of the tip 12 and to control the distribution of magnetization in the sample 14 can be directly visualized by reference to FIGS. 2A, 2B and 3. In FIG. 2A, the inter-pulse, i.e., variable evolution, interval $t_{c1}$ has been chosen such that $\gamma_{spl} t_{c1} B_{tip}^{max} \cong \pi/2$. As a result, the magnetization 32 of the sample 14, plotted along the vertical axis 32, is concentrated in the region closest to the tip 12. As inferred from the figure, this region or volume is basically proportional to $d^3$, indicating that the magnetization becomes more localized as the center 30 of the hyperpolarized sphere 28 moves closer to the sample surface. A three-dimensional plot of the localization of the nuclear spin alignment 38 in the sample 14 is also provided in FIG. 2A for the inter-pulse interval of $\pi/2$.

Therefore, a volume of localized magnetization 34 in the sample 14 represents the selected portion using this preparation sequence. The tip 12 is preferably positioned a distance d 31 from the sample surface. The volume 34 at the surface 23 is then more optimally localized, whereas a volume of magnetization 36 at a distance in the sample twice as far from the tip 12 is clearly less localized.

To summarize, according to FIG. 2A, the magnetization of the sample 14 at the surface plane is essentially contained in a circular area of radius $\sqrt{2}$ d (volume 34) at the sample surface 23, and reaches maximum amplitude. As the distance from a particular sample volume to the tip 12 increases, the magnetization of that sample volume rapidly vanishes. The volume 34, therefore, having the circular area represents a preferred selected portion of the sample 14 for measurement. A depth of the sampled volume is preferably substantially equal to or less than distance d.

The modulating step includes modulating the magnetization in the tip in response to the positioning of the tip relative to the sample. A dipolar field 40 results in a region of the tip around the tip center of curvature 30, resulting from the positioning step and the selecting step including the preparation pulse sequence 52 described for FIG. 2A. In this example, the dipolar field due to the sample reaches a magnitude $B_{spl}^{max} = 0.6 \mu_0 M_{spl}^{(0)}/(4\pi)$. The dipolar field variation is slightly less than 30% within a volume having radius a=0.7d.

By way of further explanation of this result, it is noted that the dipolar field of a uniformly magnetized infinite layer vanishes. This can be seen by considering a point located a distance d above such layer, whereby the dipolar field due to the nuclei in a central circle of radius $\sqrt{2}$ d is anti-parallel to the field generated by nuclei outside this circle. The exact cancellation upon the superposition of both contributions is a result of: the dipolar field of each individual spin diminishing with the distance to the center of the ring. However, the number of spins increases with the square of this distance. The nulling of the total dipolar field is the result of a delicate equilibrium involving regions of the sample that are far apart from each other. The magnetization distribution in the sample surface 23 obtained for the case shown in FIG. 2A implies that, after the preparation sequence of pulses, only those nuclei within the central circle 34 will contribute to the dipolar field in the tip.

However, with reference to FIG. 2B, which only shows the magnetization in the surface plane 23 of the sample, it is also possible to alter the parameters of the preparation sequence to generate, for instance, a dipolar field 42 of comparable magnitude due only to nuclei in a ring around the center 30 of the central disk. In this embodiment, the evolution interval $t_{c1}$ provided between pulses in the selecting step has been doubled to $\pi$, using the same preparation sequence $(\pi/2)_y - t_{c1} - (\pi/2)_x$. The magnetization is still contained within a circle of radius $\sqrt{2}$d but the central contribution has been removed, a situation that could be further exploited to improve resolution. For this case, the dipolar field 42 induced by the sample reaches a magnitude $B_{spl} \approx \mu_0 M_{spl}^{(0)}/(4\pi)$.

One method of achieving the distribution of FIG. 2B by subtracting the modulation of the nuclear magnetization measured in the tip for the cases of FIGS. 2A and 2B. In this case, the spatial resolution increases by a factor of 2, although the measuring time is doubled.

In another embodiment, the parameters of the preparation sequence may be altered to generate a comparable dipolar field 44 outside the central circle (FIG. 3). Here, the phase of the second pulse in the preparation sequence is changed by 90 degrees relative to the example of FIG. 2A from x toy and the inter-pulse interval is chosen to be $\gamma_{spl} t_{c1} B_{tip}^{max} = 1.06\pi$. On the surface plane, the magnetization is distributed so that only the region beyond a ring of radius $\sqrt{2}$d contributes to the dipolar field $B_{spl}$ at the tip. It is noted that this distribution is exactly the complement to the magnetic distribution shown in FIG. 2A. The sample dipolar field 44 in this case is represented by $B_{spl} \approx -0.5\mu_0 M_{spl}^{(0)}/(4\pi)$. It can be appreciated that the versatility and the almost optimum intensity of the induced dipolar field confer to the method of the present invention very singular properties that can be used to selectively get information from complementary regions.

An additional embodiment of the selecting step is represented in FIG. 4, where the selecting step includes canceling dephasing due to local chemical shift or heteronuclear interactions (dipolar, J-couplings), preferably, by the addition of a $\pi$-pulse 58 at half the contact time $t_{c1}$ in the initial preparation period 52 and in an encoding period 54.

In addition, homonuclear decoupling is necessary to prevent decoherence due to inter-spin interactions within the sample spins. Notice that the effect due to the external long-range dipolar field is preserved by a synchronous inversion of the magnetizations in the sample and tip.

The modulating step includes modulating the tip magnetization in response to the dipolar field, which in turn is affected by proximity of the sample. Referring to FIG. 4, this modulation occurs during the encoding period 54. Again, RF decoupling and synchronous reversal of the magnetization are preferable to prevent undesired dephasing. Finally, an inspection of the tip magnetization is carried out during the reading period in a detecting step. This may be accomplished by a train of time-delayed 62 pump 64/probe laser pulses 66 in the embodiment described herein using an optical source.

The detecting step preferably includes applying an encoding pulse sequence 68 to the tip in analogous fashion with applying the pulse sequence 52 in the preparation period. The encoding sequence is chosen to modulate the magnetization by an amount proportional to the magnetization of the selected portion. For example, in one embodiment, an encoding pulse sequence $(\theta)_{-y}-t_{c2}-(\theta)_x$ 68 is applied at the resonance frequency of the nuclei within the semiconductor tip, where $t_{c2}$ represents a sample-tip contact time. It should be noted that the sample-tip contact time $t_{c2}$ will be, in general, different from the one ($t_{c1}$) used during the preparation period, and the tipping angle $\theta$ may differ from the preparation angle $\pi/2$. If, as before, all inter-spin interactions are neglected, the z-component of the magnetization in the tip at the end of the sequence 68 is given by $$M_{tip}^{(z)}(t_{c2}) = M_{tip}^{(0)}\left(1 - \sin^2\theta\left(1 - \sin\left(\frac{\pi}{2}\frac{(B_{spl})_z}{(B_{spl}^{max})_{ref}}\right)\right)\right). \quad (3)$$

Here, the contact time $t_{c2}$ is preferably chosen so that $\gamma_{tip}t_{c2}(B_{spl}^{max})_{ref} \approx 2\pi/2$. In this $(B_{spl}^{max})_{ref}$ represents the peak dipolar field created by a reference sample of optimum nuclear density located near the tip 12. As Equation (3) implies, at the end of the second time interval $t_{c2}$, the tip magnetization becomes modulated by the changes of the dipolar field $(B_{spl})_z$, which, in turn, depends on the magnetization of the selected sample region. Thus, an optical inspection of the electronic spin precession in the semiconductor tip 12 by optical detection means 69 reveals a shift, $\Delta f$, with respect to the Larmor frequency, prior to manipulating the tip nuclei equal to $$\Delta f = kM_{tip}^{(0)}\sin^2\theta\left(1 - \sin\left(\frac{\pi}{2}\frac{\langle M_{spl}\rangle}{M_{spl}^{ref}}\right)\right). \quad (4)$$

The detecting means in this embodiment preferably includes optical detection means by Faraday rotation, a technique well-known to those skilled in the art.

For the parameters corresponding to FIG. 2A, for example, $\langle M_{spl}\rangle$ represents the average magnetization in a hemisphere of radius approximately equal to distance d located immediately close to the tip 12 and $M_{spl}^{ref}$ is simply a scale factor interpreted as the magnetization in the same volume with best conceivable nuclear density (reference sample). According to Equation (4), the local magnetization of the sample can be probed by optically inspecting the tip. The signal to noise of the measurement advantageously depends only on the ability to detect changes of the electronic precession frequency in the semiconductor. This, in turn, rests on the amplitude of the nuclear magnetization in the tip and the electronic de-coherence time. These parameters can be advantageously selected, as described below.

Crucial to the method and means of detection according to the present invention is having adequate control of short-range spin interactions that take place in a solid at the low temperatures necessary for optical pumping. A similar requirement is encountered in solid-state imaging or in experiments that measure spin diffusion in a solid. Therefore, multiple pulse coherent averaging is preferably employed to suppress undesired spin-spin interactions during the creation of magnetization gratings by the pulsed field gradients.

Referring still to FIG. 4, the RF pulse sequence preferably takes this condition into account: both during the preparation and encoding periods, the spin evolution takes place in the presence of homonuclear decoupling 56. On the other hand, an inversion $\pi$ pulse 58 at half each interval applied to both the tip and the sample eliminates dephasing induced by heteronuclear interactions (dipolar, J-couplings) and local chemical shifts. However, the effect due to the long-range dipolar field is preserved in both periods since the magnetizations in the sample and tip are synchronously inverted.

The finite amplitude and spatial inhomogeneities of the radio-frequency (RF) field impose a limit to the time during which it is possible to preserve coherence in the spin evolution of a solid system. In static protonated samples, for example, where the homonuclear dipolar interaction is particularly intense, this time is at most a few milliseconds in a macroscopic sample. Similarly, the modulation of the tip magnetization and, consequently, also the detection sensitivity will be optimized when the contact times between the tip and the sample are kept within this limit. The preparation time $t_{c1}$ crucially depends on the magnetization and position of the tip relative to the sample. For the conditions represented by FIG. 2A, $t_{c1}$ can be written as:

$$t_{c1} = \frac{3\pi}{2}\left(\frac{d}{a}\right)^3 \frac{1}{\mu_0 \gamma_{spl} M_{tip}^{(0)}} \quad (5)$$

In this expression, a factor of 2 has been incorporated to double the time of coupling in the absence of decoupling; i.e., to address the nominal scaling incorporated in the majority of homonuclear decoupling sequences. According to Equation (5) and as represented by the magnetized volume 34 of FIG. 2A, a preferable geometry includes the tip resting over the surface of the sample (a≈d). One associated disadvantage, however, is that the dipolar field induced by the sample becomes inhomogeneous within the tip volume. If the whole tip volume is used during the optical reading period, the tip must be separated from the sample surface, thus extending the contact time $t_{c1}$. The spatial variation of $(B_{spl})$ is about 30% throughout a volume whose radius is slightly larger than half the distance to the surface (a/d≈0.7). As a simple numerical analysis demonstrates, a 30% change of the sample dipolar field over the tip volume translates to an approximate 2% reduction of the frequency shift range. For this disposition and with a polarization of 10% (or 30%) in a GaAs tip, for example, Equation (5) yields $t_{c1}$≈0.5 ms (or 0.17 ms). Due to the cubic dependence with the distance d, this value reduces to only ~170 μs (or 57 μs) when the tip rests just above the sample surface (a≈d). To accomplish this, the semiconductor tip is preferably designed so that only the central fraction of its volume is used in the final period 60 of optical reading, using a core/shell structure in the tip, as discussed above, analogous to that found in colloidal quantum dots (see Gammon, e.g., and Bruchez). The method of detecting then includes properly tuning the laser frequency during the reading period, so that only the central region is monitored.

The contact time required during the encoding period $t_{c2}$ is inversely proportional to the sample magnetization. For a spatial distribution similar to that of FIG. 2A, its value is given by the formula $$t_{c2} \approx \frac{1}{\gamma_{tip} B_{spl}^{max}}. \quad (6)$$

For a densely protonated sample in a magnetic field of 14 T (600 MHz proton frequency) and at 4 K, for example, Equation (6) yields $t_{c2} \approx 75$ ms. This value is well within the decoherence time of the nuclei in the semiconductor tip. This is because the comparatively lower value of the gyromagnetic ratio $\gamma_{tip}$ leads to weaker dipolar interactions, which, accordingly, can be efficiently decoupled during longer times.

It should be noted that the sample magnetization in the method and apparatus of the present invention is preferably used merely to define the contact time necessary to modulate the tip magnetization. This is in striking contrast with the standard induction-based detection method known in the prior art. In the present invention, if $t_{c2}$ is kept within optimum limits, preferably <100 ms, the detection sensitivity does not depend on the sample magnetization but only on parameters associated with the semiconductor tip. One of these parameters is the tip magnetization, which determines the maximum amplitude or "scale" in the frequency shift of the electronic resonance frequency, as described by Equation (4). Another key parameter is the electronic (transverse) relaxation time since it determines the resolution or "finesse" δf with which such changes can be read. For fixed values of $t_{c1}$, $t_{c2}$ and $M_{tip}^{(0)}$, the minimum magnetization change that one can discern is inversely proportional to this time.

For example, in GaAs at 5 K the electronic relaxation time is ~2 ns implying that δf≈0.25 GHz. This value is significantly smaller than the maximum electronic frequency shift $\Delta f_{max}$, which, for this example, is 10 GHz with a polarization of only 2%. In other words, the following ratio holds: $\Delta f_{max}/\delta f \approx 40$. In addition, $\Delta f_{max} = k M_{tip} \sin^2 \theta$ ind that shorter inspection pulses (θ<π/2) may be used at the expense of a larger polarization or a longer electronic de-coherence time.

Though optical detecting means is a preferred embodiment, which includes optical detecting devices and methods known to those skilled in the art, the scope of the present invention is not limited to any particular detecting means or method. The source used to hyperpolarize the tip is likewise not meant to be limited to an optical source, but is preferably chosen to complement the detecting means as discussed above.

It can be appreciated that by applying the method described above, a method of obtaining an image of the sample is also provided. According to a method of obtaining an NMR image of the sample, the tip scans the sample, and the dipolar field, or magnetization, at the tip changes depending on the sample density immediately close to it. The modulation of the magnetization is detected according to the method described above. The resulting spatial resolution of the image is defined by the distance d separating the center of curvature in the tip from the sample surface.

Figure 5A:
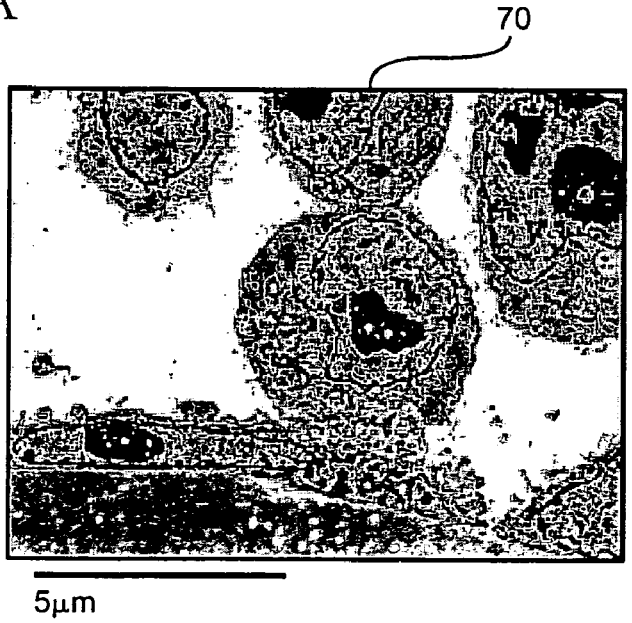
FIG. 5A is an image of a cross-section of cultured cells with nanoscopic resolution, using the well-known technique of Transmission Electron Microscopy (TEM).
Figure 5B:
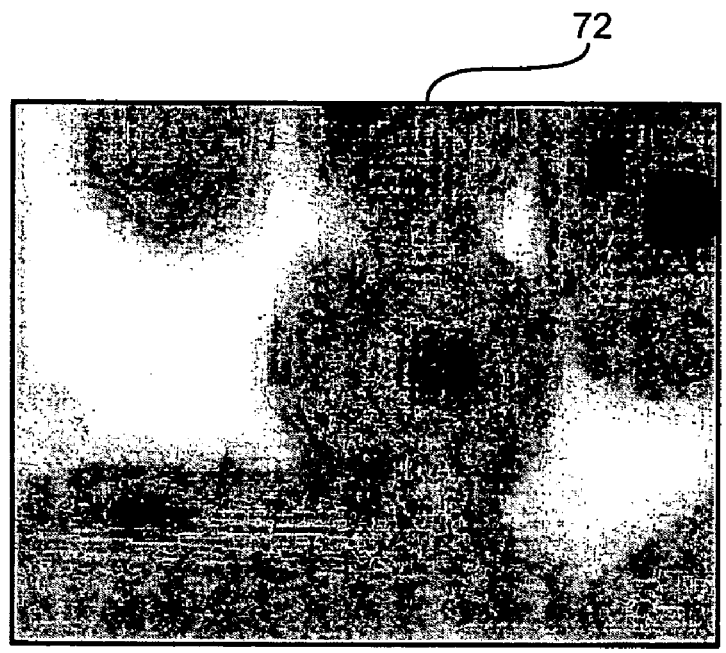
FIG. 5B is a numerical simulation of the image shown in FIG. 5A using the method of the present invention for a distance d of 0.8 micrometers (μm) from the center of the hyperpolarized tip of FIG. 1 to the surface of the sample, and wherein a radius of curvature of the tip is equal to 0.7 d.
Figure 5C:
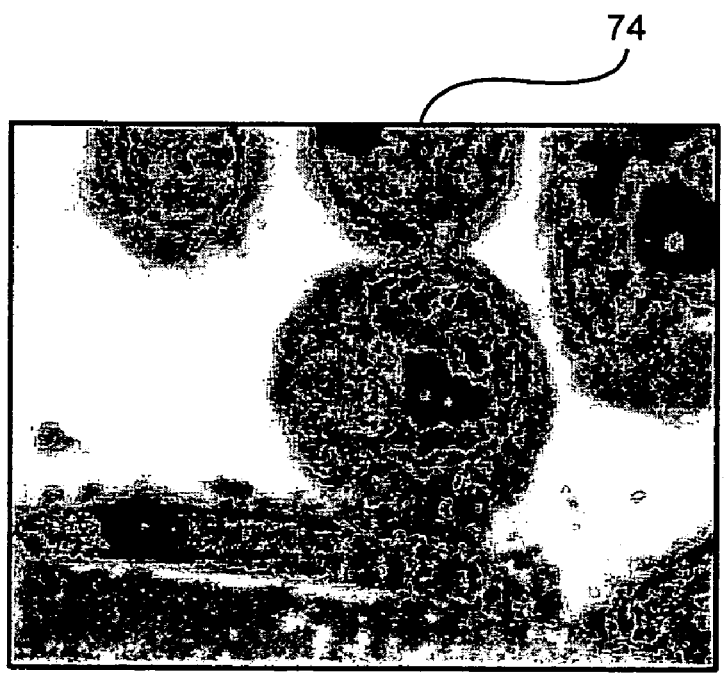
FIG. 5C is a numerical simulation of the image as described in FIG. 5B, but wherein the distance d is 0.2 μm.
Figure 5D:
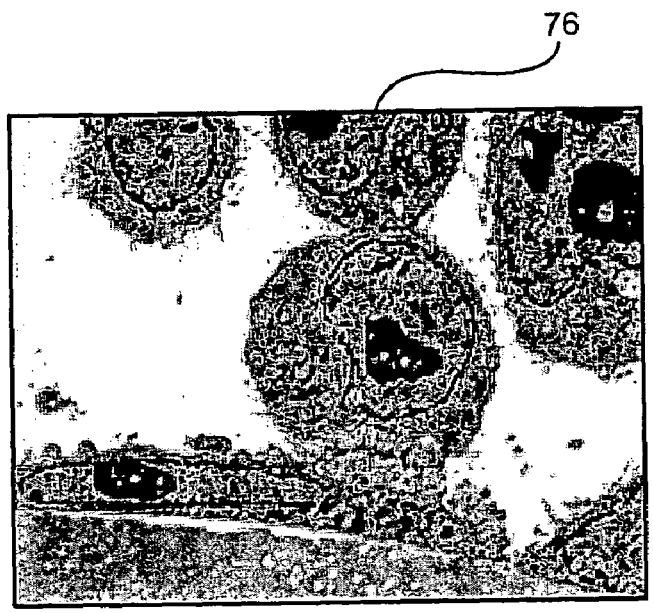
FIG. 5D is a numerical simulation of the image as described in FIG. 5B, but wherein the distance d is 50 nanometers.

Results of simulations for different values of d using this method are displayed in FIG. 5A–5D. FIG. 5A is an image of a cross-section of cultured cells obtained using transmission electron microscopy (TEM) 70 and provides the starting point for this simulation of a virtual (nuclear) spin distribution. Each pixel of this micrograph (350×520) represents a point-like magnetic dipole moment having an amplitude (or intensity) proportional to the color of the spin density (color) at the site. Following the preparation sequence 52 of FIG. 2A, the local dipolar field $B_{spl}$ was calculated for the simulation as a (fictive) tip scanned the sample. For simplicity, the sample density was assumed constant along z; it was also assumed that, due to RF decoupling, spins evolved independently from their neighbors. The resolution of the NMR image obtained improves as the distance d and consequently the size of the tip diminish. For example, FIG. 5B shows a simulation of a scanned image 72 of the same spin distribution, where the radius of the tip is 800 nanometers (nm). The image 74 of FIG. 5C likewise corresponds to a tip radius of 200 nm, and the image 76 of FIG. 5D to a 50 nm tip radius.

Figure 5E:
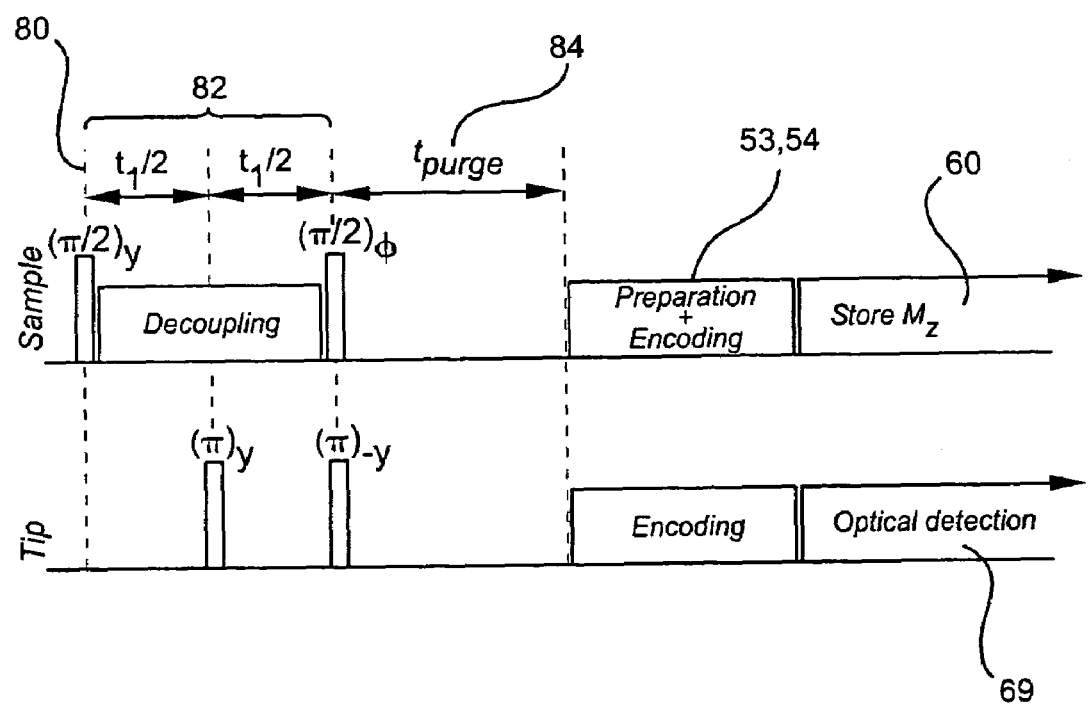
FIG. 5E is a plot of an embodiment of a pulse scheme for localized high-resolution NMR spectroscopy according to the present invention.

The method of the present invention may also be modified to provide local high-resolution spectroscopic information by means known to those skilled in the art. One method is provided herein with reference to FIG. 5E. An initial homogeneous excitation 80 is applied to the sample before the preparation 53 and encoding periods 54. The sample spins evolve over a variable period of time $t_1$ 82 at the end of which a transverse component of the magnetization is preferably stored. It should be noted that the spin evolution during $t_1$ is unaffected by the presence of the external dipolar field because the tip magnetization is inverted at $t_1/2$. An appropriate purging time $t_p$ 84 that is longer than the solid transverse relaxation time is preferably used to destroy any remaining spin coherence, as will be recognized by those skilled in the art. Finally, the method described with reference to FIG. 4 including selecting a portion of the sample during the preparation period, modulating the magnetization of the tip during the encoding period, and detecting the modulation of the magnetization during the reading period, is carried out to selectively probe the sample at each incremented $t_1$.

By incrementing $t_1$ in discrete steps, the free induction decay (FID) is obtained point-by-point. Finally, a Fourier transform of the FID provides the local nuclear resonance spectrum. Quadrature detection is preferably accomplished by cycling the phase of the second π/2-pulse from x to y. Those skilled in the art will recognize this point-by-point reconstruction scheme, which has been used in remote or indirect detection, e.g., in the encoding and remote detection of hyperpolarized xenon and other materials. The spin evolution time and the time increments are appropriately chosen to achieve the required resolution and range of the resultant transformed spectrum, according to Fourier transform theory well-known to those skilled in the art.

Another embodiment of the method of obtaining high-resolution spectroscopic NMR data includes performing multi-dimensional spectroscopy. As those skilled in the art will recognize, this procedure can be done by a straightforward extension of the method described above.

Yet another embodiment includes applying the method to obtain selective images based on the chemical composition of the sample. Alternatively, the method is easily modified to introduce relaxation contrast by means known to those skilled in the art.

The versatility of the method and apparatus of the present invention offers an appealing advantage compared to other prior art methods such as Magnetic Force Microscopy (MFM) particularly in the study of biological systems. In particular, the presence of a strongly inhomogeneous magnetic field induced by the ferromagnetic tip in MFM prevents a high-resolution spectroscopic discrimination of the nuclei. The use of the hyperpolarized tip in the present invention avoids this limitation.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A suitable for use in a nuclear magnetic resonance device for detecting a local magnetization of a sample comprising a material having a non-zero nuclear magnetic spin, the probe comprising:
   a tip comprising a material capable of being hyperpolarized and positioned to cause a dipolar interaction of said tip with the sample, said tip acquiring a magnetization in response to being hyperpolarized, the nuclear magnetic spin of a selected portion of the sample inducing a modulation of said magnetization of said tip in response to said dipolar interaction, whereby the modulation of said magnetization in said tip is proportional to the local magnetization of the selected portion; and
   a means for detecting the modulation of said magnetization in said tip, wherein said means for detecting comprises optical detection means, and wherein said optical detection means comprises an analyzer for measuring a time-resolved rotation of a transmitted polarization state of laser radiation transmitted through said tip, said time-resolved rotation corresponding to the modulation of said magnetization of said tip.

2. The probe of claim 1 said tip further comprising a structure comprising a core and a shell, whereby a measure of the modulation of said magnetization is measured substantially only from the core.

3. The probe of claim 2, wherein said probe is positioned within the sample.

4. The probe of claim 3, wherein said tip comprises a semiconductor nanocrystal.

5. The probe of claim 1, wherein said tip comprises one of Gallium Arsenide, Cadmium Selenide and Cadmium Telluride.

6. The probe of claim 1, further comprising a hyperpolarizing source.

7. The probe of claim 6, wherein said hyperpolarizing source comprises a laser and a polarizer for controlling a polarization state of the laser.

8. A nuclear magnetic resonance, comprising:
   a probe comprising a tip including a material capable of being hyperpolarized, said tip acquiring a magnetization in response to being hyperpolarized:
   a coil for manipulating nuclear magnetic spins in a sample and in the tip with a sequence of radio frequency pulses, wherein the sequence of radio frequency pulses selects a portion of the sample for measurement and allows detection of a modulation of said magnetization of said tip, wherein said tip is positioned to cause a dipolar interaction of said tip with the sample, a local magnetization of the selected portion inducing the modulation of said magnetization of said tip in response to the dipolar interaction:
   a means for detecting said modulation of said magnetization in said tip, whereby the modulation of said magnetization in said tip is proportional to the local magnetization of the selected portion; and
   an applied external magnetic field for initially aligning the nuclear magnetic spins in the sample and in the tip,
   wherein the device is adapted to provide a nuclear magnetic resonance image of the sample, further comprising a linear translator for stepping the probe to sequentially select a number of selected portions for measuring the local magnetization of each selected portion, the device providing a spatial mapping of the local magnetization of the sample material in the sample as a function of a location of the probe.

9. The device of claim 8, wherein the device is adapted to provide local high-resolution spectroscopy measurements of the sample, whereby said coil produces the sequence of pulses at incremented time intervals for generating the local high-resolution spectroscopy measurements.

10. The device of claim 8, wherein the tip further comprises a radius of curvature, and a spatial resolution of the nuclear magnetic resonance image is substantially equal to or less than said radius of curvature.

11. A nuclear magnetic resonance device, comprising:
   a probe comprising a tip including a material capable of being hyperpolarized, said tip acquiring a magnetization in response to being hyperpolarized;
   a coil for manipulating nuclear magnetic spins in a sample and in the tip with a sequence of radio frequency pulses, wherein the sequence of radio frequency pulses selects a portion of the sample for measurement and allows detection of a modulation of said magnetization of said tip, wherein said tip is positioned to cause a dipolar interaction of said tip with the sample, a local magnetization of the selected portion inducing the modulation of said magnetization of said tip in response to the dipolar interaction; and
   a means for detecting said modulation of said magnetization in said tip, whereby the modulation of said magnetization in said tip is proportional to the local magnetization of the selected portion,
   wherein the tip is positioned at a distance d from the sample surface, and the selected portion comprises a volume comprising a circular area on the sample surface of radius $\sqrt{2}$ d, the local magnetization being substantially localized within the selected portion.

12. A method for obtaining nuclear magnetic resonance data from a sample comprising a material having a non-zero nuclear magnetic spin, the method comprising the steps of:
   providing a hyperpolarized tip comprising a magnetization for probing a local magnetization of the sample, wherein said providing comprises irradiating a tip comprising a semiconductor material with a circularly polarized laser;
   positioning the hyperpolarized tip to induce a dipolar interaction between the tip and the sample;
   selecting a portion of the sample for obtaining said local magnetization from the selected portion;
   modulating an amplitude of the magnetization in the tip in response to said selecting;
   detecting said modulation of magnetization in the tip, wherein said modulation of magnetization is proportional to the local magnetization in the selected portion, said detecting comprising measuring a time-resolved rotation of a laser radiation polarization state after transmission through the tip, said measuring further comprising:
applying a time-delayed optical probe pulse following a circularly-polarized optical pump pulse to the tip; and
recording a temporal change in a linear polarization of the time-delayed optical probe pulse, wherein the temporal change provides a measure of a shift of an electronic Larmor frequency within the tip, the shift being proportional to the local magnetization of the selected portion.

13. The method of claim 12, wherein said selecting comprises inducing a non-uniform magnetization in the sample.

14. A method for obtaining nuclear magnetic resonance data from a sample comprising a material having a non-zero nuclear magnetic spin, the method comprising:
providing a hyperpolarized tip comprising a magnetization for probing a local magnetization of the sample;
positioning the hyperpolarized tip to induce a dipolar interaction between the tip and the sample;
selecting a portion of the sample for obtaining said local magnetization from the selected portion;
modulating an amplitude of the magnetization in the tip in response to said selecting; and
detecting said modulation of magnetization in the tip, wherein said modulation of magnetization is proportional to the local magnetization in the selected portion, and
wherein said providing comprises applying an electric current to a tip including a semiconductor material.

15. The method of claim 14, said detecting means comprising measuring a change in resistance of the tip, wherein the change in resistance is proportional to the modulation of magnetization.

16. The method of claim 14, wherein said providing comprises irradiating a tip comprising a semiconductor material with a circularly polarized laser.

17. The method of claim 16, said detecting comprising measuring a time-resolved rotation of a laser radiation polarization state after transmission through the tip.

18. The method of claim 14, wherein said selecting comprises inducing a non-uniform magnetization in the sample.

19. A method for obtaining nuclear magnetic resonance data from a sample comprising a material having a non-zero nuclear magnetic spin, the method comprising:
providing a hyperpolarized tip comprising a magnetization for probing a local magnetization of the sample;
positioning the hyperpolarized tip to induce a dipolar interaction between the tip and the sample;
selecting a portion of the sample for obtaining said local magnetization from the selected portion;
modulating an amplitude of the magnetization in the tip in response to said selecting; and
detecting said modulation of magnetization in the tip, wherein said modulation of magnetization is proportional to the local magnetization in the selected portion, and
wherein said selecting comprises applying a preparation sequence of radio-frequency pulses including two pulses separated by a first evolution interval $t_{c1}$ to the sample to select the portion, the local magnetization of the selected portion inducing a dipolar field on the tip in response to said preparation sequence.

20. The method of claim 19, wherein the preparation sequence further comprises an inversion pulse at half of the first evolution interval, wherein the inversion pulse substantially cancels dephasing effects due to heteronuclear inter-spin interactions in the sample.

21. The method of claim 19, wherein the preparation sequence further comprises decoupling pulses to prevent decoherence due to homonuclear inter-spin interactions in the sample.

22. The method of claim 19, wherein said selecting comprises applying the preparation sequence $(\pi/2)_y - t_{c1} - (\pi/2)_x$ to the sample, wherein $t_{c1}$ is determined according to a product $\gamma_{spl} t_{c1} B_{tip}^{max}$, wherein $\gamma_{spl}$ is a nuclear gyromagnetic ratio of nuclei in the selected portion and $B_{tip}^{max}$ is a maximum value of the dipolar field over the sample.

23. The method of claim 22, wherein $t_{c1}$ is selected so that the product equals $\pi/2$, said positioning comprising positioning the tip at a distance d from the sample surface, the selected portion comprising a volume including a circular area on the sample surface of radius $\sqrt{2}$ d.

24. The method of claim 22, wherein $t_{c1}$ is selected so that the product equals $\pi$, said positioning comprising positioning the tip at a distance d from the sample surface, the selected portion comprising a volume including an annular ring on the sample surface of radius $\sqrt{2}$ d.

25. The method of claim 19, said positioning comprising positioning the tip at a distance d from the sample surface, and wherein said selecting comprises applying the preparation sequence $(\pi/2)_y - t_{c1} - (\pi/2)_{-y}$, and selecting $t_{c1}$ so that a product $\gamma_{spl} t_{c1} B_{tip}^{max} = 1.06\pi$, wherein $\gamma_{spl}$ is a nuclear gyromagnetic ratio of nuclei in the selected portion and $B_{tip}^{max}$ is a maximum value of the dipolar field over the sample, the selected portion comprising a planar region external to a circular area on the sample surface of radius equal to $\sqrt{2}$ d.

26. The method of claim 19, said detecting further comprising:
encoding the tip by applying an encoding sequence of radio-frequency pulses comprising two encoding pulses separated by a second evolution interval $t_{c2}$ to the tip to cause said modulation of magnetization in the tip to be proportional to the local magnetization in the selected portion; and
reading said modulation of magnetization in the tip.

27. The method of claim 26, wherein the encoding sequence further comprises a second inversion pulse at half the second evolution interval, wherein the second inversion pulse substantially cancels dephasing effects due to heteronuclear inter-spin interactions in the tip.

28. The method of claim 26, wherein the encoding sequence further comprises decoupling pulses to prevent decoherence due to homonuclear inter-spin interactions in the tip.

29. The method of claim 26, wherein the encoding sequence $(\theta)_y - t_{c2} - (\theta)_x$ is applied at a resonance frequency of nuclei in the tip.

30. The method of claim 29, wherein $t_{c2}$ is chosen so that $\gamma_{tip} t_{c2} (B_{spl}^{max})_{ref} = \pi/2$, wherein $\gamma_{tip}$ is a nuclear gyromagnetic ratio of nuclei in the tip and $(B_{spl}^{max})_{ref}$ is a maximum value of the dipolar field created by a reference sample of optimum nuclear density at the tip.

31. The method of claim 30, wherein $\theta$ is equal to or less than $\pi/2$.

32. The method of claim 19, wherein said providing comprises irradiating a tip comprising a semiconductor material with a circularly polarized laser.

33. The method of claim 32, said detecting comprising measuring a time-resolved rotation of a laser radiation polarization state after transmission through the tip.

34. The method of claim 19, wherein said selecting comprises inducing a non-uniform magnetization in the sample.

35. A method for obtaining nuclear magnetic resonance data from a sample comprising a material having a non-zero nuclear magnetic spin, the method comprising:
 providing a hyperpolarized tip comprising a magnetization for probing a local magnetization of the sample;
 positioning the hyperpolarized tip to induce a dipolar interaction between the tip and the sample;
 selecting a portion of the sample for obtaining said local magnetization from the selected portion;
 modulating an amplitude of the magnetization in the tip in response to said selecting; and
 detecting said modulation of magnetization in the tip, wherein said modulation of magnetization is proportional to the local magnetization in the selected portion, and
 wherein the method is adapted to produce a nuclear magnetic resonance image of the nuclear magnetic data, the method further comprising:
 stepping the probe to sequentially select a number of selected portions for measuring the local magnetization of each selected portion; and
 mapping the local magnetization in the sample as a function of a location of the probe, said mapping providing a nuclear magnetic resonance image of the sample.

36. The method of claim 35, wherein said providing comprises irradiating a tip comprising a semiconductor material with a circularly polarized laser.

37. The method of claim 36, said detecting comprising measuring a time-resolved rotation of a laser radiation polarization state after transmission through the tip.

38. The method of claim 35, wherein said selecting comprises inducing a non-uniform magnetization in the sample.

39. A method for obtaining local high-resolution spectroscopic nuclear magnetic resonance data from a sample that comprises a material having a non-zero nuclear magnetic spin, the method comprising:
 providing a hyperpolarized tip comprising a magnetization for probing a local magnetization of the sample;
 positioning the hyperpolarized tip to induce a dipolar interaction between the tip and the sample;
 applying a homogeneous excitation sequence of pulses separated by an initial evolution time to the sample, followed by a purging time;
 selecting a portion of the sample for obtaining said local magnetization from the selected portion, said selecting comprising applying a preparation sequence of radio-frequency pulses including two pulses separated by a first evolution interval $t_{e1}$ to the sample to select the portion, the local magnetization of the selected portion inducing a dipolar field on the tip in response to said preparation sequence;
 modulating the magnetization in the tip in response to said selecting;
 detecting said modulation of magnetization in the tip, wherein said modulation of magnetization is proportional to the local magnetization in the selected portion;
 applying a second homogeneous excitation sequence of pulses separated by an incremented initial evolution time to the sample, followed by the purging time; and
 obtaining a free induction decay;
 repeating said selecting, said modulating, said detecting, and said obtaining steps for the incremented initial evolution time to obtain a series comprising the free induction decays; and
 performing a Fourier transform of the series of free induction decays, said performing providing the local high-resolution spectroscopic nuclear magnetic resonance data.

40. The method of claim 39, further comprising:
 stepping the probe to sequentially select a number of selected portions for measuring the local magnetization of each selected portion; and repeating the acts of applying, selecting, modulating, detecting, applying, repeating, and performing for each of the number of selected portions to provide a spatial mapping of the local high-resolution spectroscopic nuclear magnetic resonance data of the sample.

41. A method for obtaining nuclear magnetic resonance data from a sample comprising a material having a non-zero nuclear magnetic spin, the method comprising the steps of:
 providing a hyperpolarized tip comprising a magnetization for probing a local magnetization of the sample, wherein said providing comprises irradiating a tip comprising a semiconductor material with a circularly polarized laser;
 positioning the hyperpolarized tip to induce a dipolar interaction between the tip and the sample;
 selecting a portion of the sample for obtaining said local magnetization from the selected portion;
 modulating an amplitude of the magnetization in the tip in response to said selecting;
 detecting said modulation of magnetization in the tip, wherein said modulation of magnetization is proportional to the local magnetization in the selected portion, said detecting comprising measuring a time-resolved rotation of a laser radiation polarization state after transmission through the tip,
 wherein the hyperpolarized tip comprises a structure including a core and a shell, said detecting further comprising tuning a frequency of the circularly polarized laser, wherein said measuring comprises measuring the time-resolved rotation through only the core of the tip in response to said tuning.

* * * * *